United States Patent
Kaneko

(12) 
(10) Patent No.: US 6,496,030 B1
(45) Date of Patent: Dec. 17, 2002

(54) SCAN FLIP-FLOP PROVIDING BOTH SCAN AND PROPAGATION DELAY TESTING

(75) Inventor: Koichi Kaneko, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/614,257

(22) Filed: Jul. 12, 2000

(30) Foreign Application Priority Data

Mar. 27, 2000 (JP) .......................................... 2000-086363

(51) Int. Cl.⁷ .......................... H03K 19/00; G01R 31/28
(52) U.S. Cl. ........................ 326/16; 326/95; 714/726; 327/203
(58) Field of Search ............................... 326/46, 16, 93, 326/95; 327/202, 203, 211, 212, 218; 714/726, 724, 730

(56) References Cited

U.S. PATENT DOCUMENTS 5,015,875 A * 5/1991 Giles et al. ................. 327/203
5,444,404 A * 8/1995 Ebzery ........................ 327/185
5,469,079 A * 11/1995 Mahant-Shetti et al. ...... 326/46
5,784,384 A * 7/1998 Maeno ...................... 371/22.31

FOREIGN PATENT DOCUMENTS

JP          5-11030          1/1993

OTHER PUBLICATIONS

Tsui, Frank F.; "LSI/VLSI Testability Design", McGraw–Hill Book Company, Fig. 5–1(c) and Fig. 5–1(d) 1987.

* cited by examiner

Primary Examiner—Daniel D. Chang
(74) Attorney, Agent, or Firm—Leydig, Voit & Mayer, Ltd.

(57) ABSTRACT

A semiconductor integrated circuit device is provided with a selector that selects a normal operation signal or a circuit diagnosis input signal depending upon a first-mode input signal. A first latch and a second latch selectively execute one of (i) a scan mode for either holding or transmitting one of the normal operation signal and the circuit diagnosis input signal, selected by the selector depending upon a clock signal, and (ii) a long delay path function mode for transmitting a transmission signal irrespective of the clock signal, depending upon a second-mode input signal.

4 Claims, 3 Drawing Sheets

SCAN FLIP-FLOP PROVIDING BOTH SCAN AND PROPAGATION DELAY TESTING

FIELD OF THE INVENTION

The present invention relates to a semiconductor integrated circuit device which has a design that facilitates testing the manufacturing state of a wafer to check whether the semiconductor integrated circuit device satisfies a desired circuit performance based on a design standard.

BACKGROUND OF THE INVENTION

Usually, from the viewpoint of improving the reliability in the operation of a semiconductor integrated circuit device, it is necessary to check a wafer in a manufacturing state of the semiconductor integrated circuit device to check whether the semiconductor integrated circuit device satisfies a desired circuit performance or not. As methods for performing such a test, there is known a method of adding a group of gate circuits (a long delay path) to the semiconductor integrated circuit device and a method of adding a scan path group, constructed based on what is called a design for testability, to the semiconductor integrated circuit device.

FIG. 4 is a diagram that shows a circuit construction of the above gate circuit group. This gate circuit group is constructed to have logic gates such as AND gates and OR gates connected in series of several hundred stages between an input buffer and an output buffer. Such a gate circuit group is located within a semiconductor integrated circuit device at a position where it operates independent of the operation of the circuits that achieve the primary functions of the semiconductor integrated circuit device. A test using this gate circuit group is carried out such that a desired signal is first input into an input terminal (IN), and propagation delay time of this signal is monitored when it is output from an output terminal (OUT). The circuitry is diagnosed based on this propagation delay time.

This test is based on the fact that logic gates (semiconductors) on the same semiconductor integrated circuit device, or the same wafer, have substantially the same characteristics, and therefore, the circuit diagnosis of the gate circuit group can be equivalently applied to the diagnosis of the logic circuits that achieve the primary functions of the semiconductor integrated circuit device.

On the other hand, circuits that constitute a scan path group are designed so that they are built into the logic circuits that achieve the primary functions within the semiconductor integrated circuit device. The performance of the circuitry is diagnosed by verifying an output result corresponding to a predetermined scan signal that is input into the logic circuits (hereinafter to be referred to as a scan test). A multi-stage connection of scan flip-flop circuits is known as a representative example of the circuitry that forms the scan path group.

Generally, within a semiconductor integrated circuit device that has been designed to be built in with a scan path group, that is, within a scan-designed semiconductor integrated circuit device, there are disposed a plurality of scan flip-flops that input or output normal-operation input signals to be input during a normal operation or circuit-diagnosis input signals to be input for carrying out the test, at an input pre-stage and an output post-stage of sequential circuits or combination circuits (hereinafter to be collectively referred to as combination circuits) that achieve the primary functions of the semiconductor integrated circuit device.

The plurality of scan flip-flops disposed at the input pre-stage (hereinafter to be referred to as a flip-flop pre-stage section) are constructed such that, when the normal operation mode has been selected, a plurality of externally-applied normal signals are input in parallel to the flip-flop pre-stage section of the combination circuits, and so that, when the test mode has been selected, circuit diagnosis input signals are delivered in series to the flip-flop pre-stage section.

Similarly, the plurality of scan flip-flops disposed at the output post-stage (hereinafter to be referred to as a flip-flop post-stage section) are constructed such that, when the normal operation mode has been selected, a plurality of signals output from the combination circuits are input in parallel to the post-stage section, and that, when the test mode has been selected, circuit diagnosis input signals that have been delivered in series at the flip-flop pre-stage section are delivered in series to the flip-flop post-stage section.

Based on the above arrangement, during the normal operation mode, the scan path group can execute the primary input and output operations of the combination circuits. During the test mode, the scan path group can sequentially take out the output of the combination circuits obtained from the input of the circuit diagnosis input signals, from a predetermined scan flip-flop at the flip-flop post-stage section. Thus, it is possible to diagnose the combination circuits based on the result of this output.

FIG. 5 is a diagram that shows a circuit construction of the above-described scan flip-flop. This scan flip-flop consists of a selector 101, a first latch 102, a second latch 103, and an inverter G10 for inverting a clock signal T. The selector 101 selectively outputs a normal operation input signal D and a circuit diagnosis input signal SI, according to a mode changeover input signal SMC.

The selector 101 consists of an inverter G111 that inverts the mode changeover input signal SMC, an N-channel transmission gate N111 that receives the mode changeover input signal SMC from a control terminal (a gate) and receives the normal operation input signal D from one contact terminal (a source or a drain), and an N-channel transmission gate N112 that receives the output signal of the inverter G111 at a control terminal (a gate) and receives the circuit diagnosis input signal SI from one contact terminal (a source or a drain). The other contact terminal (a drain or a source) of the N-channel transmission gate N111 and the other contact terminal (a drain or a source) of the N-channel transmission gate N112 are connected with each other. The circuit diagnosis input signal SI or the normal operation input signal D is selectively output from the node between these contact terminals.

The first latch 102 receives the normal operation input signal D or the circuit diagnosis input signal SI output by the selector 101, holds the received signal and transmits it to the second latch 103 at the next stage, according to the clock signal T.

The first latch 102 consists of an N-channel transmission gate N121 that receives the clock signal T from a contact terminal (a gate) and whose one contact terminal (a source or a drain) is connected to an output terminal of the selector 101 as an input terminal of the first latch 102. The first latch 102 also has an N-channel transmission gate N122 that receives the output of the inverter G10 at a control terminal (a gate) and whose one contact terminal (a source or a drain) is connected to the other contact terminal (a drain or a source) of the N-channel transmission gate N121. The first latch 102 also has an inverter G121 whose input terminal is connected to the other contact terminal (a drain or a source)

of the N-channel transmission gate N121 and whose output terminal is also an output terminal of the first latch 102. The first latch further has an inverter G122 whose input terminal is connected to the output terminal of the inverter G121 and whose output terminal is connected to the other contact terminal (a drain or a source) of the N-channel transmission gate N122.

The second latch 103 is a circuit that holds and outputs a signal output from the first latch 102 according to the clock signal T. The second latch 103 consists of an N-channel transmission gate N131 that receives the output of the inverter G10 from a control terminal (a gate) and whose one contact terminal (a source or a drain) is connected to an output terminal of the first latch 102 as an input terminal of the second latch 103. The second latch 103 also has an N-channel transmission gate N132 that receives the clock signal T from a control terminal (a gate) and whose one contact terminal (a source or a drain) is connected to the other contact terminal (a drain or a source) of the N-channel transmission gate N131. The second latch 103 also has an inverter G131 whose input terminal is connected to the other contact terminal (a drain or a source) of the N-channel transmission gate N131 and whose output terminal is also an output terminal of the second latch 103, that is, as a terminal for outputting an output signal Q of the scan flip-flop. The second latch 103 further has an inverter G132 whose input terminal is connected to the output terminal of the inverter G131 and whose output terminal is connected to the other contact terminal (a drain or a source) of the N-channel transmission gate N132.

The operation of the scan flip-flop will be now explained. First, when the logic level of the mode changeover input signal SMC is "L(Low)", the N-channel transmission gate N111 is turned OFF and the N-channel transmission gate N112 is turned ON. As a result, the circuit diagnosis input signal SI is selectively output from the selector 101. In other words, the scan flip-flop is in test mode when the mode changeover input signal SMC of the logic level "L" is input.

When the logic level of the clock signal T is "H(High)", the N-channel transmission gate N121 in the first latch 102 is turned ON. Therefore, the circuit diagnosis input signal SI output from the selector 101 is input into the inverter G121 through the N-channel transmission gate N121. The control terminal of the N-channel transmission gate N122 is supplied with a "L" level signal which is an inverted signal of the clock signal T of the logic level "H". Therefore, the N-channel transmission gate N122 is turned OFF, and the output terminal of the inverter G122 is set to a release state. The output signal of the inverter G122 is not input into the inverter G121. In other words, the first latch 102 transmits an inverted signal of the circuit diagnosis input signal SI to the second latch 103 in the next stage.

Similarly, when the logic level of the clock signal T is "H", in the second latch 103, the control terminal of the N-channel transmission gate N131 is supplied with a "L" level signal which is an inverted signal of the clock signal T of the logic level "H". Therefore, the N-channel transmission gate N131 is turned OFF, and the signal output from the first latch 102 is not transmitted to the inverter G131. On the other hand, the control terminal of the N-channel transmission gate N132 is input with the clock signal T of the logic level "H". Therefore, the N-channel transmission gate N132 is turned ON, and the signal output from the inverter G131 is inverted by the inverter G132, and is then recursively input into the inverter G131.

In other words, the second latch 103 holds a signal of the logic level that had been output from the inverter G131 until immediately before the logic level of the clock signal T becomes "H". In this state, the signal of the logic level held by the inverters G131 and G132 of the second latch 103 is output as the output signal Q.

When the logic level of the clock signal T is "L", the N-channel transmission gate N121 in the first latch 102 is turned OFF. Therefore, the circuit diagnosis input signal SI that has been output from the selector 101 is not input into the inverter G121. On the other hand, the control terminal of the N-channel transmission gate N122 is supplied with a "H" level signal which is an inverted signal of the clock signal T of the logic level "L". Therefore, the N-channel transmission gate N122 is turned ON, and the signal output from the inverter G121 is inverted by the inverter G122, and is then recursively input into the inverter G121. In other words, the first latch 102 holds the signal of a logic level that had been output from the inverter G121 immediately before the logic level of the clock signal T became "L".

Similarly, when the logic level of the clock signal T is "L", in the second latch 103, the control terminal of the N-channel transmission gate N131 is supplied with a "H" level signal which is an inverted signal of the clock signal T of the logic level "L". Therefore, the N-channel transmission gate N131 is turned ON. The signal output from the first latch 102, that is, the signal of the logic level held by the inverters G121 and G122 of the first latch 102, is input into the inverter G131 through the N-channel transmission gate N131.

In the same state, the control terminal of the N-channel transmission gate N132 is input with the clock signal T of the logic level "L", and the N-channel transmission gate N132 is turned OFF. Therefore, the output terminal of the inverter G132 is set to a release state, and its output signal is not input into the inverter G131. In other words, the second latch 103 outputs the inverted signal of the signal output from the first latch 102, as the output signal Q of the scan flip-flop.

As explained above, in the test mode operation of the scan flip-flop, when the clock signal T has a logic level "L", the first latch 102 latches the inverted signal of the circuit diagnosis input signal SI at this point of time and inputs this inverted signal to the second latch 103. When the clock signal T changes to the logic level "H", the second latch 103 latches and outputs the inverted signal of the signal that has been output from the first latch 102 at this point of time. Therefore, the scan flip-flop outputs the circuit diagnosis input signal SI by delaying the output by one cycle time of the clock signal T.

When the mode changeover input signal SMC has a logic level "H" and the scan flip-flop is in the normal operation mode, the first latch 102 and the second latch 103 carry out a operation similar to that described above respectively, except that the normal operation input signal D is output from the selector 101 in place of the circuit diagnosis input signal SI. Therefore, this explanation will be omitted.

As explained above, the conventional semiconductor integrated circuit device facilitates the diagnosis of the circuit performance and improves the reliability of the operation, according to the design for facilitating the test based on the addition of the gate circuit group and the introduction of the scan path group such as the scan flip-flops.

However, the gate circuit group and the scan path group have different test objects as explained above. Therefore, when it is desired to carry out both the monitoring of the propagation delay time in the logic gate and the scan test of the combined circuits, it has been necessary to design the semiconductor integrated circuit devices such that the circuits for achieving the monitoring and the scan test are separately built into the semiconductor integrated circuit devices.

In recent years, along with the increase in the levels of functions and increase in the processing speed of the semiconductor integrated circuit devices, there has been a tendency that the combined circuits and other logic circuits built into the semiconductor integrated circuit devices are becoming more complex. Therefore, the addition of the circuits necessary for the test brings about an increase in the scale of the circuits. Further, the increase in the number of electrode terminals (pads) has become unavoidable in order to implement the test.

SUMMARY OF THE INVENTION

It is an object of the present invention to provide a semiconductor integrated circuit device which can restrict an increase in the circuit scale and which can achieve both the monitoring of the propagation delay time and the test of functions.

In order to achieve the above object by solving the aforementioned problems, according to the present invention, there is provided a semiconductor integrated circuit device having a selector circuit that selects a normal operation signal to be input into the logic circuit during a normal operation mode and a circuit diagnosis input signal to be input into the logic circuit during a test mode, according to a first-mode changeover input signal, and a latch circuit that has a logic gate for inputting and holding or transmitting one of the normal operation signal and the circuit diagnosis input signal (hereinafter to be referred to as a transmission signal) that has been selected by the selector circuit, and that selectively executes a scan mode for either holding or transmitting the transmission signal according to a clock signal and a long delay path function mode for transmitting the transmission signal irrespective of the clock signal, according to a second-mode changeover input signal. Thus, the latch circuit constructed by the test facilitation design functions as a holder for the scan test and as a long delay path by utilizing the logic gates. As a result, it is possible to selectively execute the two kinds of circuit diagnosis test in one latch circuit.

Further, the latch circuit is equipped with at least one latch that has a logic gate for transmitting or holding the transmission signal, a first controller for transmitting or interrupting the transmission signal according to the clock signal when the second-mode changeover input signal shows the scan test mode and for transmitting the transmission signal to the logic gate when the second-mode changeover input signal shows the long delay path function mode, and a second controller for selectively controlling the transmission or the holding of the transmission signal in the logic gate according to the clock signal. The first controller selects the execution of the scan test or the long delay path function. When the scan test has been selected, the logic gates function as the holder for the scan test. When the long delay path function has been selected, the logic gates function as the long delay path. As a result, it is possible to selectively execute the two kinds of circuit diagnosis test in one latch circuit.

Further, first controller has at least one first transmission gate, and the transmission signal is transmitted to the logic gate through the first transmission gate, and the second controller has at least one second transmission gate, and the logic gate selectively controls the transmission and the holding of the transmission signal in the logic gate by ON/OFF controlling the second transmission gate based on the clock signal. The first controller controls the selection of the transmission of the transmission signal to the logic gate based on the first transmission gate, and the second controller controls the selection of the transmission or the holding of the transmission signal based on the second transmission gate. Therefore, it is possible to select either the scan mode or the long delay path function mode by suitably selecting the logic levels to be given to the first and second transmission gates.

Further, the first and second transmission gates are N-/P-channel transmission gates. N-/P-channel transistor gates are used for controlling the transmission or the holding of the transmission signal in the first controller and the second controller respectively. Therefore, it is possible to achieve a stable and secure transmission of the signal of the logic level "H".

Further, the logic gate has a first inverter for inverting a signal transmitted through the first controller and outputting the inverted signal, a second inverter for inverting a signal output from the first inverter and inputting the inverted signal to the first inverter through the second controller, and a third transmission gate for interrupting an output signal of the second inverter from being input into the first inverter when the second-mode changeover input signal shows the long delay path function mode. When the second-mode changeover input signal shows the long delay path function mode, the third transmission gate interrupts the output signal of the second inverter from being recursively input into the first inverter, where the second inverter becomes valid only when the logic gate functions as the holder, and the first inverter becomes valid both when the logic gate functions as the transmitter and as the holder. Therefore, it is possible to avoid the collision of the signal generated at the input stage of the first inverter by interrupting the second transmission gate from being turned ON during the long delay path function mode.

Other objects and features of this invention will become apparent from the following description with reference to the accompanying drawings.

DESCRIPTION OF THE PREFERRED EMBODIMENTS

Preferred embodiments of a semiconductor integrated circuit device relating to the present invention will be explained in detail with reference to the drawings. However, this invention is not limited to these embodiments.

Explanation is provided for a semiconductor integrated circuit device of a first embodiment. The semiconductor integrated circuit device of the first embodiment has scan flip-flops capable of selecting monitoring of a propagation delay time (hereinafter to be referred to as a long delay path function) and a scan test.

Circuit construction and operation of the scan flip-flop will be explained next. The layout positions of the scan flip-flop on the semiconductor integrated circuit device and input and output of signals in combined circuits and the scan flip-flop to be tested are similar to those of the conventional scan flip-flop.

Figure 1:
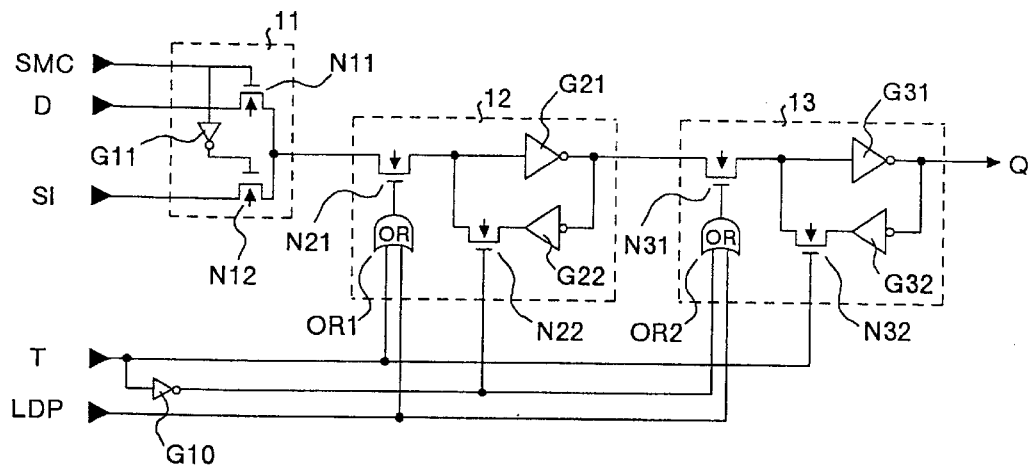
FIG. 1 is diagram showing a circuit construction of a scan flip-flop in a semiconductor integrated circuit device relating to a first embodiment of the present invention.

FIG. 1 is a diagram that shows a circuit construction of the scan flip-flop in a semiconductor integrated circuit device relating to the first embodiment. This scan flip-flop consist of a selector 11, a first latch 12, a second latch 13, and an inverter G10 for inverting a clock signal T and outputting this inverted signal. The selector 11 selectively outputs the normal operation input signal D and the circuit diagnosis input signal SI depending upon the first-mode changeover input signal SMC.

The selector 11 consists of an inverter G11 that inverts the first-mode changeover input signal SMC. The selector 11 further has an N-channel transmission gate N11 that receives the first-mode changeover input signal SMC from a control terminal (a gate) and receives the normal operation input signal D from one contact terminal (a source or a drain). The selector 11 further has an N-channel transmission gate N12 that receives the output of the inverter G11 from a control terminal (a gate) and receives the circuit diagnosis input signal SI from one contact terminal (a source or a drain). The other contact terminal (a drain or a source) of the N-channel transmission gate N11 and the other contact terminal (a drain or a source) of the N-channel transmission gate N12 are connected with each other. The circuit diagnosis input signal SI or the normal operation input signal D is selectively output from the node between these contact terminals.

The first latch 12 receives the normal operation input signal D or the circuit diagnosis input signal SI selected by the selector 11, holds the input signal and transmits it to the second latch 13 in the next stage depending upon the clock signal T. Further, the first latch 12 selects either the execution of scan test or monitoring of a propagation delay time depending upon a second-mode changeover input signal LDP.

The first latch 12 consists of an OR gate OR1 that receives the second-mode changeover input signal LDP from one input terminal and receives the clock signal T from the other input terminal. The first latch 12 further has an N-channel transmission gate N21 whose control terminal (a gate) is connected to an output terminal of the OR gate OR1 and whose one contact terminal (a source or a drain) is connected to an output terminal of the selector 11 as an input terminal of the first latch 12. The first latch 12 further has an N-channel transmission gate N22 that receives the output of the inverter G10 from a control terminal (a gate) and whose other contact terminal (a drain or a source) is connected to one contact terminal (a source or a drain) of the N-channel transmission gate N21. The first latch 12 further has an inverter G21 whose input terminal is connected to the other contact terminal (a drain or a source) of the N-channel transmission gate N21 and whose output terminal is also an output terminal of the first latch 12. The first latch 12 further has and an inverter G22 whose input terminal is connected to the output terminal of the inverter G21 and whose output terminal is connected to the other contact terminal (a drain or a source) of the N-channel transmission gate N22.

The second latch 13 holds and outputs a signal output from the first latch 12 depending upon the clock signal T. This second latch 13 also selects the execution of scan test or monitoring of a propagation delay time depending upon the second-mode changeover input signal LDP.

The second latch 13 consists of an OR gate OR2 that receives the second-mode changeover input signal LDP from one input terminal and receives output signal of the inverter G10 from the other input terminal. The second latch 13 further has an N-channel transmission gate N31 whose control terminal (a gate) is connected to an output terminal of the OR gate OR2 and one contact terminal (a source or a drain) is connected to an output terminal of the first latch 12 as an input terminal of the second latch 13. The second latch 13 further has an N-channel transmission gate N32 that receives the clock signal T from a control terminal (a gate) and whose other contact terminal (a drain or a source) is connected to one contact terminal (a source or a drain) of the N-channel transmission gate N31. The second latch 13 further has an inverter G31 whose input terminal is connected to the other contact terminal (a drain or a source) of the N-channel transmission gate N31 and whose output terminal becomes the output terminal of the second latch 13, that is, as a terminal for outputting an output signal Q of the scan flip-flop. The second latch 13 further has and an inverter G32 whose input terminal is connected to the output terminal of the inverter G31 and whose output terminal is connected to the other contact terminal (a drain or a source) of the N-channel transmission gate N32.

The operation of the scan flip-flops will be explained next. When the logic level of the first-mode changeover input signal SMC is "L", the test mode is selected and the logic level of the second-mode changeover input signal LDP becomes "L". When the logic level of the second-mode changeover input signal LDP is "L", this means that the scan flip-flop is set to the scan test mode.

In this case, in the selector 11, the N-channel transmission gate N11 is turned OFF and the N-channel transmission gate N12 is turned ON. As a result, the circuit diagnosis input signal SI is selectively output from the selector 11.

When the logic level of the clock signal T is "H", in the first latch 12, the OR gate OR1 outputs a signal of the logic level "H" based on the input of the clock signal T of the logic level "H" and the input of the second-mode changeover input signal LDP of the logic level "L". In other words, a signal of the logic level "H" is input into the gate of the N-channel transmission gate N21.

As a result, the N-channel transmission gate N21 is turned ON, and the circuit diagnosis input signal SI output from the selector 11 is input into the inverter G21 through the N-channel transmission gate N21. In the same state, the control terminal of the N-channel transmission gate N22 is supplied with the clock signal T of the logic level "L" which is an inverted signal of the clock signal T of the logic level "H". Therefore, the N-channel transmission gate N22 is turned OFF, and the output terminal of the inverter G22 is set to a release state. The output signal of the inverter G22 is not input into the inverter G21. In other words, the first latch 12 transmits an inverted signal of the circuit diagnosis input signal SI to the second latch 13 in the next stage.

Similarly, in a state that the logic level of the clock signal T is "H", in the second latch 13, the OR gate OR2 outputs a signal of the logic level "L" based on the input of the clock signal T of the logic level "L" which is an inverted signal of the clock signal T of the logic level "H" and the input of the second-mode changeover-input signal LDP of the logic level "L". In other words, a signal of the logic level "L" is input into the gate of the N-channel transmission gate N31.

As a result, the N-channel transmission gate N31 is turned OFF, and the signal that has been output from the first latch 12 is not transmitted to the inverter G31. On the other hand, in the same state, the control terminal of the N-channel transmission gate N32 is supplied with the clock signal T of the logic level "H". Therefore, the N-channel transmission gate N32 is turned ON, and the signal that has been output from the inverter G31 is inverted by the inverter G32, and the inverted signal is recursively input into the inverter G31.

In other words, the second latch 13 holds a signal of the logic level that has been output from the inverter G31 until immediately before the logic level of the clock signal T changes to "H". In this state, the signal of the logic level held by the inverters G31 and G32 of the second latch 13 is output as the output signal Q.

When the logic level of the clock signal T has become "L", in the first latch 12, the OR gate OR1 outputs a signal of the logic level "L" based on the clock signal T of the logic level "L" and the second-mode changeover input signal LDP of the logic level "L". In other words, a signal of the logic level "L" is input into the gate of the N-channel transmission gate N21.

As a result, the N-channel transmission gate N21 is turned OFF, and the circuit diagnosis input signal SI output from the selector 11 is not input into the inverter G21. On the other hand, in the same state, the control terminal of the N-channel transmission gate N22 is supplied with the clock signal T of the logic level "H" which is an inverted signal of the clock signal T of the logic level "L". Therefore, the N-channel transmission gate N22 is turned ON, and the signal that has been output from the inverter G21 is inverted by the inverter G22, and the inverted signal is recursively input into the inverter G21. In other words, the first latch 12 holds a signal of the logic level that has been output from the inverter G21 until immediately before the logic level of the clock signal T changes to "L".

Similarly, in a state that the logic level of the clock signal T is "L", in the second latch 13, the OR gate OR2 outputs a signal of the logic level "H" based on the clock signal T of the logic level "H" which is an inverted signal of the clock signal T of the logic level "L" and the second-mode changeover input signal LDP of the logic level "L". In other words, a signal of the logic level "H" is input into the gate of the N-channel transmission gate N31.

As a result, the N-channel transmission gate N31 is turned ON, and the signal that has been output from the first latch 12 is input into the inverter G31 through the N-channel transmission gate N31. In other words, the signal of the logic level that has been held by the inverters G21 and G22 of the first latch 12 is input into the inverter G31 through the N-channel transmission gate N31.

In the same state, the control terminal of the N-channel transmission gate N32 is supplied with the clock signal T of the logic level "L". Therefore, the N-channel transmission gate N32 is turned OFF, and the output terminal of the inverter G32 is set to a release state. The output signal of the inverter G32 is not input into the inverter G31. In other words, the second latch 13 outputs an inverted signal of the output of the first latch 12 as the output signal Q of the scan flip-flops.

Therefore, when the logic level of the second-mode changeover input signal LDP is "L", the scan flip-flop that constitute the semiconductor integrated circuit device relating to the first embodiment can be used for carrying out the scan test as has been carried out conventionally.

Next, a case will be considered in which the logic level of the second-mode changeover input signal LDP is "H". This means that the scan flip-flop is set in the long delay path function mode. In this case, the selector 11 does not depend on the logic level of the second-mode changeover input signal LDP, and operates in a manner similar to that described above. Therefore, the explanation of the operation of the selector 11 will be omitted here.

When the second-mode changeover input signal LDP of the logic level "H" is input into one input terminal of the OR gate OR1 of the first latch 12, the OR gate OR1 outputs a signal of the logic level "H" irrespective of the logic level of the clock signal T that is input into the other input terminal. As a result, the N-channel transmission gate N21 maintains the ON state, and inverts the normal operation input signal D or the circuit diagnosis input signal SI that has been output from the selector 11, through the N-channel transmission gate N21 and the inverter G21, and outputs the inverted signal.

Similarly, when the second-mode changeover input signal LDP of the logic level "H" is input into one input terminal of the OR gate OR2 of the second latch 13, the OR gate OR2 outputs a signal of the logic level "H" irrespective of the logic level of the clock signal T that is input into the other input terminal. As a result, the N-channel transmission gate N31 maintains the ON state, and inverts the signal that has been output from the first latch 12, through the N-channel transmission gate N31 and the inverter G31, and outputs the inverted signal.

Therefore, when the logic level of the second-mode changeover input signal LDP is "H", the scan flip-flop transmits the normal operation input signal D or the circuit diagnosis input signal SI that has been input into the selector 11 to the outside without changing the logic level of the signal through the selector 11, the first latch 12 and the second latch 13.

Figure 4:
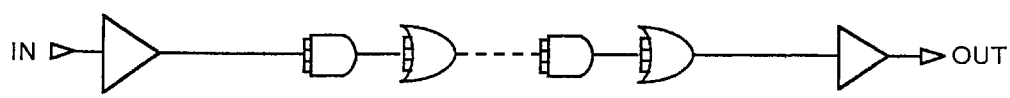
FIG. 4 is a diagram showing a conventional circuit construction of a gate circuit group.
Figure 5:
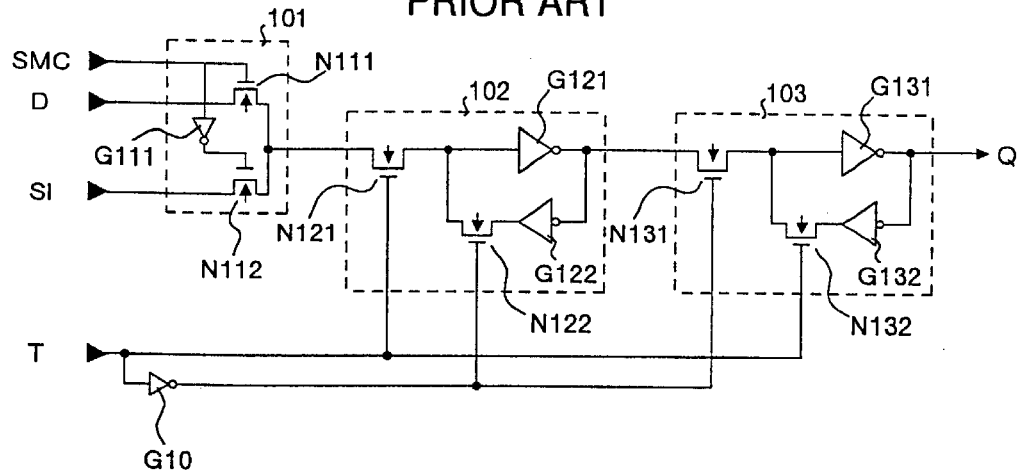
FIG. 5 is a diagram showing a conventional circuit construction of a scan flip-flop.

With the above arrangement, the scan flip-flop that constitute the semiconductor integrated circuit device relating to the first embodiment does not function as a memory but it is equivalent to a simple gate-connected circuit. As a result, the scan flip-flop achieves the long delay path function similar to that of the conventional circuit that has simple gates connected in multi-stages as shown in FIG. 4. In other words, the propagation delay time of a signal that has been propagated through the inverters of the first latch 12 and the second latch 13 respectively can be measured. The measured propagation delay time then can be compared with a propagation delay time that has been confirmed by simulation in advance. Based on this comparison, it is possible to decide whether a manufactured integrated circuit satisfies a desired circuit performance based on the design standard or not.

As explained above, according to the semiconductor integrated circuit device relating to the first embodiment, an OR gate is provided in each latch of the conventional scan flip-flop. The N-channel transmission gates for permitting the input of a signal to each latch are ON/OFF controlled based on the output signals from the OR gates. Each OR gate is supplied with the clock signal T and the second-mode changeover input signal LDP for ON/OFF controlling the N-channel transmission gates. Thus, by setting the logic level of the second-mode changeover input signal LDP to "H", it is possible to execute the conventional scan test. On the contrary, by setting the logic level of the second-mode changeover input signal LDP to "L", it is possible to execute the long delay path function.

As explained above, in the semiconductor integrated circuit device that has been designed to facilitate the testing, it is possible to selectively carry out scan test and monitoring of a propagation delay time in the construction of the scan flip-flops without providing separate additional gate circuits. As a result, it is possible to restrict an increase in the circuit scale.

Explanation is provided for a semiconductor integrated circuit device of a second embodiment. The semiconductor integrated circuit device of the second embodiment is different from the semiconductor integrated circuit device of the first embodiment in that, in the scan flip-flop, the N-channel transmission gates N11, N12, N21, N22, N31 and N32 shown in FIG. 1 are replaced by N-/P-channel transmission gates respectively. Further, inverters are provided for operating these N-/P-channel transmission gates. Other constructions and operation are similar to those of the first embodiment.

Figure 2:
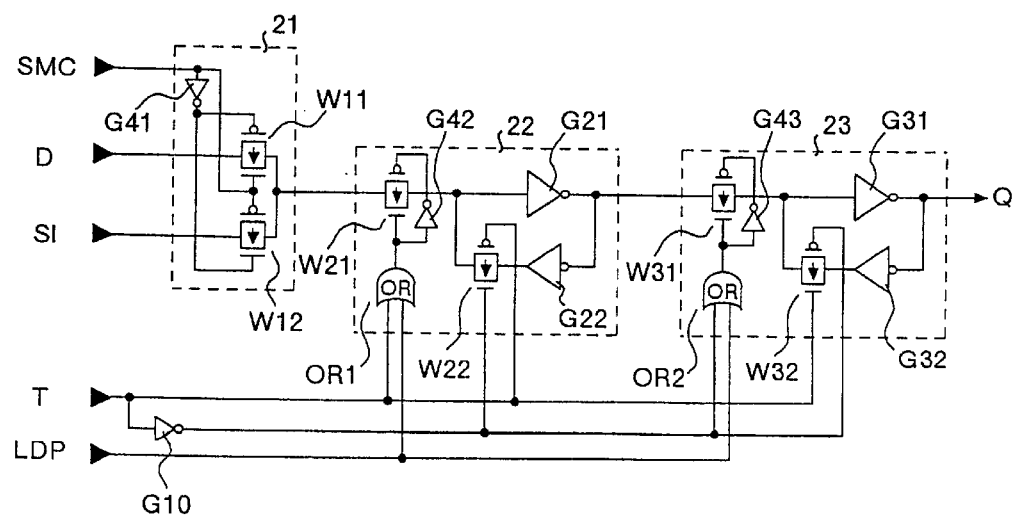
FIG. 2 is a diagram showing a circuit construction of a scan flip-flop in a semiconductor integrated circuit device relating to a second embodiment of the present invention.

FIG. 2 is a diagram that shows a circuit construction of the scan flip-flop in a semiconductor integrated circuit device of the second embodiment. In FIG. 2, parts that are common to those in FIG. 1 are provided with identical legends and their explanation will be omitted. This scan flip-flop consist of a selector 21, a first latch 22, a second latch 23, and an inverter G10 for inverting a clock signal T.

The selector 21 selectively outputs a normal operation input signal D or a circuit diagnosis input signal SI depending upon a first-mode changeover input signal SMC. The selector 21 consists of an inverter G41 that inverts the first-mode changeover input signal SMC and outputs this inverted signal. The selector 21 further has an N-/P-channel transmission gate W11 that receives a first-mode changeover input signal SMC from a positive-phase control terminal (a gate of an N-channel transistor), receives an output signal of the inverter G41 from a negative-phase control terminal (a gate of a P-channel transistor), and receives a normal operation input signal D from one contact terminal (a source or a drain). The selector 21 further has an N-/P-channel transmission gate W12 that receives the first-mode changeover input signal SMC from a negative-phase control terminal (a gate of a P-channel transistor), receives an output signal of the inverter G41 from a positive-phase control terminal (a gate of an N-channel transistor), and receives a circuit diagnosis input signal SI from one contact terminal (a source or a drain).

The other contact terminal (a drain or a source) of the N-/P-channel transmission gate W11 and the other contact terminal (a drain or a source) of the N-/P-channel transmission gate W12 are connected with each other. The circuit diagnosis input signal SI or the normal operation input signal D is selectively output from the node between the two contact terminals.

Like the first latch 12 explained in the first embodiment, the first latch 22 also receives the normal operation input signal D or the circuit diagnosis input signal SI selected by the selector 21, and selects either the holding and transmission of the signal in the scan test mode to the second latch 23 in the next stage or the transmission of the signal in the long delay path function mode to the second latch 23 depending upon the clock signal T and the second-mode changeover input signal LDP.

The first latch 22 consists of an OR gate OR1, an inverter G21, an inverter G22, an inverter G42 that inverts an output signal of the OR gate OR1. The first latch 22 further has an N-/P-channel transmission gate W21 that receives an output signal of the OR gate OR1 to a positive-phase control terminal (a gate of an N-channel transistor), receives an output-signal of the inverter G42 to a negative-phase control terminal (a gate of a P-channel transistor), whose one contact terminal (a source or a drain) is connected to an output terminal of the selector 21 as an input terminal of the first latch 22, and whose other contact terminal (a drain or a source) is connected to an input terminal of the inverter G21. The first latch 22 further has an N-/P-channel transmission gate W22 that receives an output signal of the inverter G10 to a positive-phase control terminal (a gate of an N-channel transistor), receives the clock signal T to a negative-phase control terminal (a gate of a P-channel transistor), whose one contact terminal (a source or a drain) is connected to the other contact terminal (a drain or a source) of the N-/P-channel transmission gate W21, and whose other contact terminal (a drain or a source) is connected to an output terminal of the inverter G22.

Like the first latch 13 explained in the first embodiment, the second latch 23 also receives a signal output from the first latch 22, and selects either the holding and outputting of the signal in the scan test mode to the outside or the outputting of the signal in the long delay path function mode to the outside depending upon the clock signal T and the second-mode changeover input signal LDP.

The second latch 23 consists of an OR gate OR2, an inverter G31, an inverter G32, an inverter G43 that inverts an output signal of the OR gate OR2. The second latch 23 further has an N-/P-channel transmission gate W31 that receives an output signal of the OR gate OR2 to a positive-phase control terminal (a gate of an N-channel transistor), receives an output signal of the inverter G43 to a negative-phase control terminal (a gate of a P-channel transistor), whose one contact terminal (a source or a drain) is connected to an output terminal of the first latch 22 as an input terminal of the second latch 23, and whose other contact terminal (a drain or a source) is connected to an input terminal of the inverter G31. The second latch 23 further has an N-/P-channel transmission gate W32 that receives the clock signal T to a positive-phase control terminal (a gate of an N-channel transistor), receives the output signal of the inverter G10 to a negative-phase control terminal (a gate of a P-channel transistor), whose one contact terminal (a source or a drain) is connected to the other contact terminal (a drain or a source) of the N-/P-channel transmission gate W31, and whose other contact terminal (a drain or a source) is connected to an output terminal of the inverter G32.

The operation of this scan flip-flop will be explained next. When the logic level of the first-mode changeover input signal SMC is "L", the test mode is selected and the logic level of the second-mode changeover input signal LDP becomes "L". Thus, the scan test mode is selected.

In this case, the N-/P-channel transmission gate W11 is turned OFF and the N-/P-channel transmission gate W12 is turned ON. As a result, an operation similar to that of the selector 11 explained in the first embodiment is carried out.

When the logic level of the clock signal T is "H", the OR gate OR1 outputs a signal of the logic level "H". Thus, a signal of the logic level "H" is input into the positive-phase control terminal of the N-/P-channel transmission gate W21, and a signal of the logic level "L" is input into the negative-phase control terminal through the inverter G42. In other words, the N-/P-channel transmission gate W21 is turned ON. As a result, an operation similar to that of the N-channel transmission gate N21 explained in the first embodiment is carried out.

Further, in a state that the logic level of the clock signal T is "H", a signal of the logic level "L" is input into the positive-phase control terminal of the N-/P-channel transmission gate W22 through the inverter G10, and a signal of the logic level "H" is input into the negative-phase control terminal. In other words, the N-/P-channel transmission gate W22 is turned OFF. As a result, an operation similar to that of the N-channel transmission gate N22 explained in the first embodiment is carried out.

Similarly, in a state that the logic level of the clock signal T is "H", in the second latch 23, the OR gate OR2 outputs a signal of the logic level "L". Thus, a signal of the logic level "L" is input into the positive-phase control terminal of the N-/P-channel transmission gate W31, and a signal of the logic level "H" is input into the negative-phase control terminal through the inverter G43. In other words, the N/P-channel transmission gate W31 is turned OFF. As a result, an operation similar to that of the N-channel transmission gate N31 explained in the first embodiment is carried out.

Further, in a state that the logic level of the clock signal T is "H", a signal of the logic level "H" is input into the positive-phase control terminal of the N-/P-channel transmission gate W32, and a signal of the logic level "L" is input into the negative-phase control terminal through the inverter G10. In other words, the N-/P-channel transmission gate W32 is turned ON. As a result, an operation similar to that of the N-channel transmission gate N32 explained in the first embodiment is carried out.

When the logic level of the clock signal T changes to "L", the OR gate OR1 outputs a signal of the logic level "L". Thus, a signal of the logic level "L" is input into the positive-phase control terminal of the N-/P-channel transmission gate W21, and a signal of the logic level "H" is input into the negative-phase control terminal through the inverter G42. In other words, the N-/P-channel transmission gate W21 is turned OFF. As a result, an operation similar to that of the N-channel transmission gate N21 explained in the first embodiment is carried out.

Further, in a state that the logic level of the clock signal T is "L", a signal of the logic level "H" is input into the positive-phase control terminal of the N-/P-channel transmission gate W22 through the inverter G10, and a signal of the logic level "L" is input into the negative-phase control terminal. In other words, the N-/P-channel transmission gate W22 is turned ON. As a result, an operation similar to that of the N-channel transmission gate N22 explained in the first embodiment is carried out.

Similarly, in a state that the logic level of the clock signal T is "L", in the second latch 23, the OR gate OR2 outputs a signal of the logic level "H". Thus, a signal of the logic level "H" is input into the positive-phase control terminal of the N-/P-channel transmission gate W31, and a signal of the logic level "L" is input into the negative-phase control terminal through the inverter G43. In other words, the N/P-channel transmission gate W31 is turned ON. As a result, an operation similar to that of the N-channel transmission gate N31 explained in the first embodiment is carried out.

Further, in a state that the logic level of the clock signal T is "L", a signal of the logic level "L" is input into the positive-phase control terminal of the N-/P-channel transmission gate W32, and a signal of the logic level "H" is input into the negative-phase control terminal through the inverter G10. In other words, the N-/P-channel transmission gate W32 is turned OFF. As a result, an operation similar to that of the N-channel transmission gate N32 explained in the first embodiment is carried out.

Therefore, when the logic level of the second-mode changeover input signal LDP is "L", like the first embodiment, the scan flip-flop that constitute the semiconductor integrated circuit device relating to the second embodiment can be used for carrying out the scan test as has been carried out conventionally.

Next, a case will be considered in which the logic level of the second-mode changeover input signal LDP is "H" and the scan flip-flop has been set to the long delay path function mode. In this case, the selector 21 does not depend on the logic level of the second-mode changeover input signal LDP, and operates in a manner similar to that described above. Therefore, the explanation of the operation of the selector 21 will be omitted here.

When the second-mode changeover input signal LDP of the logic level "H" is input into one input terminal of the OR gate OR1 of the first latch 22, the OR gate OR1 outputs a signal of the logic level "H" irrespective of the logic level of the clock signal T input into the other input terminal. As a result, the N-/P-channel transmission gate W21 maintains the ON state, and inverts the normal operation input signal D or the circuit diagnosis input signal SI that has been output from the selector 21 through the N-/P-channel transmission gate W21 and the inverter G21, and outputs the inverted signal.

Similarly, when the second-mode changeover input signal LDP of the logic level "H" is input into one input terminal of the OR gate OR2 of the second latch 23, the OR gate OR2 outputs a signal of the logic level "H" irrespective of the logic level of the clock signal T input into the other input terminal. As a result, the N-/P-channel transmission gate W31 maintains the ON state, and inverts the signal that has been output from the first latch 22 through the N-/P-channel transmission gate W31 and the inverter G31, and outputs the inverted signal.

Therefore, when the logic level of the second-mode changeover input signal LDP is "H", the scan flip-flop transmits the normal operation input signal D or the circuit diagnosis input signal SI that has been input into the selector 21 to the outside without changing the logic level of the signal through the selector 21, the first latch 22 and the second latch 23.

With the above arrangement, the scan flip-flop that constitute the semiconductor integrated circuit device relating to the second embodiment does not function as a memory but function as a long delay path, like the scan flip-flop of the first embodiment.

As explained above, according to the semiconductor integrated circuit device relating to the second embodiment, an OR gate is provided in each latch of the conventional scan flip-flops. The N-channel transmission gates for permitting the input of a signal to each latch are ON/OFF controlled based on the output signals from the OR gates. Each OR gate is supplied with the clock signal T and the second-mode changeover input signal LDP for ON/OFF controlling the N-channel transmission gates. Thus, by setting the logic level of the second-mode changeover input signal LDP to "H", it is possible to execute the conventional scan test. On the contrary, by setting the logic level of the second-mode changeover input signal LDP to "L", it is possible to execute the long delay path function.

As explained above, in the semiconductor integrated circuit device that has been designed to facilitate the testing, it is possible to selectively carry out scan test and monitoring of a propagation delay time in the construction of the scan flip-flop without providing separate additional gate circuits. As a result, it is possible to restrict an increase in the circuit scale.

Further, as the N-/P-channel transmission gates are used as ON/OFF controlled transmission gates in the selector 21, the first latch 22 and the second latch 23 respectively, it is possible to achieve a stable and secure transmission of a signal of the logic level "H" with an improved precision of the testing.

Explanation is provided here for a semiconductor integrated circuit device of a third embodiment. The semiconductor integrated circuit device of the third embodiment is different from the semiconductor integrated circuit device relating to the first embodiment in only that, in the scan flip-flop, P-channel transmission gates for preventing a malfunction of the long delay path function mode are provided in the first latch 12 and the second latch 13 respectively. Other constructions and operation are similar to those of the first embodiment.

According to the scan flip-flop shown in FIG. 1, the N-channel transmission gates N21 and N31 are usually set to ON when the long delay path function mode is selected, and the signal output from the selector 11 is transmitted to the outside through the first latch 12 and the second latch 13. However, depending on the state of the logic level of the clock signal T, there is a case where the N-channel transmission gates N22 and N32 are set to ON and the output signals from the inverters G22 and G32 respectively are recursively input into the inverters G22 and G32.

In other words, there is a risk that the signal transmitted through the N-channel transmission gates N21 and N31 collides with the output signals from the inverters G22 and G32 at the input stages of the inverters G21 and G31, and as a result, a malfunction occurs in the first latch 12 and the second latch 13.

In the scan flip-flop of the third embodiment, P-channel transmission gates are provided in the first latch and the second latch respectively in order to avoid the collision of signals at the input stages of the inverters G21 and G31.

Figure 3:
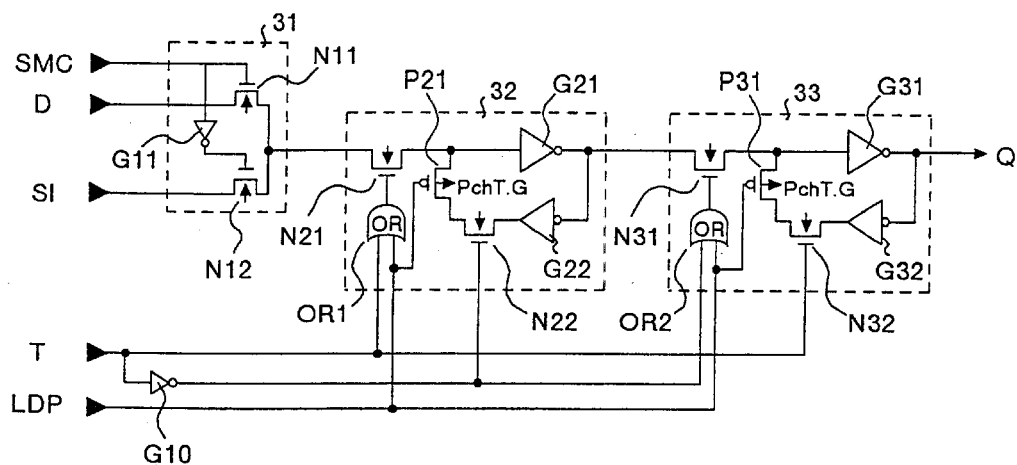
FIG. 3 is a diagram showing a circuit construction of a scan flip-flop in a semiconductor integrated circuit device relating to a third embodiment of the present invention.

FIG. 3 is a diagram showing a circuit construction of the scan flip-flops in the semiconductor integrated circuit device of to the third embodiment of the present invention. In FIG. 3, parts that are common to those in FIG. 1 are provided with identical legends and their explanation will be omitted. This scan flip-flop consist of a selector 31, a first latch 32, a second latch 33, and an inverter G10 for inverting a clock signal T.

The selector 31 has a construction and an operation similar to those of the selector 11 shown in FIG. 1, and their explanation will be omitted here. Like the first latch 12 explained in the first embodiment, the first latch 32 receives the normal operation input signal D or the circuit diagnosis input signal SI selected by the selector 31, and selects either the holding and transmission of the signal in the scan test mode to the second latch 33 in the next stage or the transmission of the signal in the long delay path function mode to the second latch 33 depending upon the clock signal T and the second-mode changeover input signal LDP.

The first latch 32 consists of an OR gate OR1, an inverter G21, an inverter G22, a P-channel transmission gate P21 that receives a second-mode changeover input signal LDP from a control terminal (a gate) and whose one contact terminal (a source or a drain) is connected to the input terminal of the inverter G21. The first latch 32 further has an N-channel transmission gate N21 whose control terminal (a gate) is connected to the output terminal of the OR gate OR1 and whose one contact terminal (a source or a drain) is connected to the output terminal of the selector 31 as an input terminal of the first latch 32, and whose other contact terminal (a drain or a source) is connected to the input terminal of the inverter G21. The first latch 32 further has an N-channel transmission gate N22 that receives an output signal of the inverter G10 from a control terminal (a gate), whose other contact terminal (a drain or a source) is connected to one contact terminal (a source or a drain) of the P-channel transmission gate P21, and whose other contact terminal (a drain or a source) is connected to the output terminal of the inverter G22.

Like the first latch 13 explained in the first embodiment, the second latch 33 also receives a signal output from the first latch 32, and selects either the holding and outputting of the signal in the scan test mode to the outside or the outputting of the signal in the long delay path function mode to the outside depending upon the clock signal T and the second-mode changeover input signal LDP.

The second latch 33 consists of an OR gate OR2, an inverter G31, an inverter G32, a P-channel transmission gate P31 that receives a second-mode changeover input signal LDP from a control terminal (a gate) and whose one contact terminal (a source or a drain) is connected to the input terminal of the inverter G31. The second latch 33 further has an N-channel transmission gate N31 whose control terminal (a gate) is connected to the output terminal of the OR gate OR1, whose one contact terminal (a source or a drain) is connected to the output terminal of the first latch 32 as an input terminal of the second latch 33, and whose other contact terminal (a drain or a source) is connected to the input terminal of the inverter G31. The second latch 33 further has an N-channel transmission gate N32 that receives the clock signal T from a control terminal (a gate), whose other contact terminal (a drain or a source) is connected to one contact terminal (a source or a drain) of the P-channel transmission gate P31, and whose other contact terminal (a drain or a source) is connected to the output terminal of the inverter G32.

The operation of the scan flip-flops will be explained next. When the logic level of the first-mode changeover input signal SMC is "L", the test mode is selected and the logic level of the second-mode changeover input signal LDP becomes "L". Thus, the scan test mode is selected.

When the logic level of the clock signal T is "H", in the first latch 32, the OR gate OR1 outputs a signal of the logic level "H". Thus, a signal of the logic level "H" is input into the control terminal of the N-channel transmission gate N21, and the N-channel transmission gate N21 is turned ON. A signal of the logic level "L" is input into the control terminal of the N-channel transmission gate N22 through the inverter G10, and the N-channel transmission gate N22 is turned OFF.

Further, the second-mode changeover input signal LDP of the logic level "L" is input into the control terminal of the P-channel transmission gate P21, and the P-channel transmission gate P21 is turned ON. In other words, the input terminal of the inverter G21 and one contact terminal of the N-channel transmission gate N22 become conductive. Accordingly, the operation carried out is similar to the operation of the first latch 12 in the first embodiment when the logic level of the first-mode changeover input signal SMC is "L", the logic level of the second-mode changeover input signal LDP is "L" and the logic level of the clock signal T is "H".

Similarly, when the logic level of the clock signal T is "H", in the second latch 33, the OR gate OR2 outputs a signal of the logic level "L". Thus, a signal of the logic level "L" is input into the control terminal of the N-channel transmission gate N31, and the N-channel transmission gate N31 is turned OFF. A signal of the logic level "H" is input into the control terminal of the N-channel transmission gate N32, and the N-channel transmission gate N32 is turned ON.

Further, the second-mode changeover input signal LDP of the logic level "L" is input into the control terminal of the P-channel transmission gate P31, and the P-channel transmission gate P31 is turned ON. In other words, the input terminal of the inverter G31 and one contact terminal of the N-channel transmission gate N32 become conductive. Accordingly, the operation carried out is similar to the operation of the second latch 13 in the first embodiment when the logic level of the first-mode changeover input signal SMC is "L", the logic level of the second-mode changeover input signal LDP is "L" and the logic level of the clock signal T is "H".

Next, when the logic level of the clock signal T has changes to "L", the OR gate OR1 outputs a signal of the logic level "L". Thus, a signal of the logic level "L" is input into the control terminal of the N-channel transmission gate N21, and the N-channel transmission gate N21 is turned OFF. A signal of the logic level "H" is input into the control terminal of the N-channel transmission gate N22 through the inverter G10, and the N-channel transmission gate N22 is turned ON.

As the logic level of the second-mode changeover input signal LDP is kept at "L" level in the P-channel transmission gate P21, the input terminal of the inverter G21 and the other contact terminal of the N-channel transmission gate N22 become conductive. Accordingly, the operation carried out is similar to the operation of the first latch 12 in the first embodiment when the logic level of the first-mode changeover input signal SMC is "L", the logic level of the second-mode changeover input signal LDP is "L" and the logic level of the clock signal T is "L".

Similarly, in a state that the logic level of the clock signal T is "L", in the second latch 33, the OR gate OR2 outputs a signal of the logic level "H". Thus, a signal of the logic level "H" is input into the control terminal of the N-channel transmission gate N31, and the N-channel transmission gate N31 is turned ON. A signal of the logic level "L" is input into the control terminal of the N-channel transmission gate N32, and the N-channel transmission gate N32 is turned OFF.

As the logic level of the second-mode changeover input signal LDP is kept at "L" in the P-channel transmission gate P31, the input terminal of the inverter G31 and the other contact terminal of the N-channel transmission gate N32 become conductive. Accordingly, the operation carried out is similar to the operation of the second latch 13 in the first embodiment when the logic level of the first-mode changeover input signal SMC is "L", the logic level of the second-mode changeover input signal LDP is "L" and the logic level of the clock signal T is "L".

Therefore, like the first embodiment, when the logic level of the second-mode changeover input signal LDP is "L", the scan flip-flop that constitute the semiconductor integrated circuit device relating to the third embodiment can be used for carrying out the scan test as has been carried out conventionally.

Next, a case will be considered in which the logic level of the second-mode changeover input signal LDP is "H" and the scan flip-flop has been selected to the long delay path function mode. In this case, the selector 31 does not depend on the logic level of the second-mode changeover input signal LDP, and operates in a manner similar to that described above. Therefore, the explanation of the operation of the selector 31 will be omitted here.

When the second-mode changeover input signal LDP of the logic level "H" is input into one input terminal of the OR gate OR1 of the first latch 32, the OR gate OR1 outputs a signal of the logic level "H" irrespective of the logic level of the clock signal T that is input into the other input terminal. As a result, the N-channel transmission gate N21 maintains the ON state, and inverts the normal operation input signal D or the circuit diagnosis input signal SI that has been output from the selector 31, through the N-channel transmission gate N21 and the inverter G21, and outputs the inverted signal.

In this case, as the logic level of the second-mode changeover input signal LDP is "H", the P-channel transmission gate P21 is turned OFF, and one contact terminal of the N-channel transmission gate N22 becomes in the release state irrespective of the ON/OFF state of the N-channel transmission gate N22, that is, irrespective of the logic level of the clock signal T. Therefore, when the long delay path function mode is selected, it is possible to securely prevent the output signal of the inverter G22 from being recursively input into the inverter G21. As a result, it is possible to avoid the collision of signals.

Similarly, when the second-mode changeover input signal LDP of the logic level "H" is input into one input terminal of the OR gate OR2 of the second latch 33, the OR gate OR2 outputs a signal of the logic level "H" irrespective of the logic level of the inverted signal of the clock signal T that is input into the other input terminal. As a result, the N-channel transmission gate N31 maintains the ON state, and inverts the signal that has been output from first latch 32, through the N-channel transmission gate N31 and the inverter G31, and outputs the inverted signal.

In this case, as the logic level of the second-mode changeover input signal LDP is "H", the P-channel transmission gate P31 is turned OFF, and one contact terminal of the N-channel transmission gate N22 becomes in the release state irrespective of the ON/OFF state of the N-channel transmission gate N32, that is, irrespective of the logic level of the clock signal T. Therefore, when the long delay path function mode has been selected, it is possible to securely prevent the output signal of the inverter G32 from being recursively input into the inverter G31. As a result, it is possible to avoid the collision of signals.

Therefore, when the logic level of the second-mode changeover input signal LDP is "H", the scan flip-flops can achieve the long delay path function in a similar manner to that of the first embodiment, without the risk of the occurrence of the collision of signals.

As explained above, according to the semiconductor integrated circuit device relating to the third embodiment, an OR gate is provided in each latch of the conventional scan flip-flop. The N-channel transmission gates for permitting the input of a signal to each latch are ON/OFF controlled based on the output signals from the OR gates. Each OR gate is supplied with the clock signal T and the second-mode changeover input signal LDP for ON/OFF controlling the N-channel transmission gates. Thus, by setting the logic level of the second-mode changeover input signal LDP to "H", it is possible to execute the conventional scan test. On the contrary, by setting When the logic level of the second-mode changeover input signal LDP to "L", it is possible to execute the long delay path function.

As explained above, in the semiconductor integrated circuit device that has been designed to facilitate the testing, it is possible to selectively carry out scan test and monitoring of a propagation delay time in the construction of the scan flip-flops without providing separate additional gate circuits. As a result, it is possible to restrict an increase in the circuit scale.

Further, when the long delay path function mode has been selected in the first latch 22 and the second latch 23, the P-channel transistor gate for completely interrupting the transmission of the respective output signals of the inverters G22 and G32 can avoid the collision of the signals at the input stages of the inverters G21 and G31 respectively. As a result, it is possible to achieve a stable and secure monitoring of a propagation delay time with improved reliability.

The transmission gates shown in FIG. 3 can also be replaced with the N-/P-channel transmission gates as explained in the second embodiment.

In the semiconductor integrated circuit devices explained in the first to third embodiments, the transmission gates that constitute the scan flip-flop are not limited to the N-channels or P-channels. Those transmission gates can be suitably combined with inverters based on a selective design.

As explained above, according to the present invention, the latch circuits that are constructed based on a design for testability can function as holders for executing a scan test. At the same time, the latch circuits can also function as a long delay path by utilizing the logic gates as the construction elements of the latch circuits. Therefore, it is possible to selectively execute the scan test and the monitoring of a propagation delay time in one latch circuit without separately providing additional gate circuits for obtaining the long delay path function. As a result, it is possible to restrict an increase in the scale of the circuits.

Further, the first controller selects either the execution of the scan test or the execution of the long delay path function. When the scan test has been selected, the logic gates function as the holder for the scan test. When the long delay path function has been selected, the logic gates function as the long delay path. Therefore, it is possible to selectively execute the scan test and the monitoring of a propagation delay time in one latch circuit without separately providing additional gate circuits for obtaining the long delay path function and without substantially changing the conventional latch circuit construction. As a result, it is possible to restrict an increase in the scale of the circuits.

Further, the first controller controls the selection of the transmission gate to the logic gate by the first transmission gate, and the second controller controls the selection of either the transmission or holding of the transmission signal by the second transmission gate. Therefore, by suitably selecting the logic level of the signal to be given to the first and second transmission gates, it is possible to select the scan mode or the long delay path function mode. As a result, it is possible to easily change over between the execution of the scan test and the execution of the long delay path function.

Further, when the N-/P-channel transmission gates are used for controlling the transmission or holding of the transmission signal by the first controller and the second controller, it is possible to achieve a stable and secure transmission of a signal of the logic level "H". As a result, it is possible to improve the precision of the testing.

Further, when the second-mode changeover input signal represents the long delay path function mode, the third transmission gate interrupts the output signal of the second inverter from being recursively input into the first inverter, where the second inverter becomes valid only when the logic gate functions as the holder, and the first inverter becomes valid both when the logic gate functions as the transmitter and as the holder. Therefore, it is possible to avoid the collision of the signal generated at the input stage of the first inverter by interrupting the second transmission gate from being turned ON during the long delay path function mode. As a result, it is possible to achieve a more stable and more reliable monitoring of a propagation delay time.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor integrated circuit device for diagnosing logic circuit performance, the semiconductor integrated circuit device comprising:

a selector circuit that receives a first-mode input signal, and selects one of (i) a normal operation signal input into a logic circuit during a normal operation mode and (ii) a circuit diagnosis input signal input into the logic circuit during a test mode, in response to the first-mode input signal; and a latch circuit including a logic gate for receiving and selectively holding and transmitting the one of the normal operation signal and the circuit diagnosis input signal, as a transmission signal, that has been selected by the selector circuit, the latch circuit:

receiving a clock signal having different first and second states and a second-mode input signal having different first and second states; and selectively executing one of (i) a scan mode holding and transmitting, respectively, the transmission signal in response to the first and second states of the clock signal received, and (ii) a long delay path function mode transmitting the transmission signal irrespective of the first and second states of the clock signal, in response to only one of the first and second states of the second-mode input signal received, and including at least one latch that includes the logic gate for selectively transmitting and holding the transmission signal, a first controller selectively transmitting and interrupting the transmission signal depending upon whether the clock signal is in the first state or the second state when the second-mode input signal causes selection of the scan mode and transmitting the transmission signal to the logic gate when the second-mode input signal causes selection of the long delay path function mode, and a second controller for selectively controlling transmission and holding of the transmission signal in the logic gate in response to whether the clock signal is in the first state or the second state.

2. The semiconductor integrated circuit device according to claim 1, wherein the first controller has a first transmission gate and the transmission signal is transmitted to the logic gate through the first transmission gate, and the second controller has a second transmission gate, and the logic gate selectively controls transmission and holding of the transmission signal in the logic gate by controlling the second transmission gate in response to whether the clock signal is in the first state or the second state.

3. The semiconductor integrated circuit device according to claim 2, wherein the first and second transmission gates are N-/P-channel transmission gates.

4. The semiconductor integrated circuit device according to claim 2, wherein the logic gate includes:

a first inverter which inverts a signal transmitted through the first controller to produce an inverted output;

a second inverter which inverts the output of the first inverter to produce an inverted signal and inputs the inverted signal to the first inverter through the second controller; and a third transmission gate which interrupts input of the inverted signal to the first inverter when the second-mode input signal causes selection of the long delay path function mode.

* * * * *